United States Patent
Melanson et al.

(10) Patent No.: US 8,723,438 B2
(45) Date of Patent: May 13, 2014

(54) SWITCH POWER CONVERTER CONTROL WITH SPREAD SPECTRUM BASED ELECTROMAGNETIC INTERFERENCE REDUCTION

(75) Inventors: John L. Melanson, Austin, TX (US); Michael A. Kost, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 999 days.

(21) Appl. No.: 12/781,669

(22) Filed: May 17, 2010

(65) Prior Publication Data

US 2010/0253305 A1 Oct. 7, 2010

Related U.S. Application Data

(63) Continuation-in-part of application No. 11/967,269, filed on Dec. 31, 2007, now Pat. No. 7,719,246, and a continuation-in-part of application No. 11/967,271, filed on Dec. 31, 2007, now Pat. No. 8,040,703, and a continuation-in-part of application No. 11/967,273, filed on Dec. 31, 2007, now Pat. No. 7,746,043, and a continuation-in-part of application No. 11/967,275, filed on Dec. 31, 2007, now Pat. No. 7,969,125, and a continuation-in-part of application No. 12/047,262, filed on Mar. 12, 2008, now Pat. No. 7,804,256.

(60) Provisional application No. 60/915,547, filed on May 2, 2007, provisional application No. 60/894,295, filed on Mar. 12, 2007.

(51) Int. Cl.
*H05B 37/02* (2006.01)

(52) U.S. Cl.
USPC ......... 315/247; 323/282; 315/307; 315/209 R

(58) Field of Classification Search
USPC .............. 315/247, 274, 224, 291, 307, 209 R
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |

(Continued)

FOREIGN PATENT DOCUMENTS

| | | |
|---|---|---|
| DE | 19713814 | 10/1998 |
| EP | 0632679 | 1/1995 |

(Continued)

OTHER PUBLICATIONS

Texas Instruments, Two-Phase Interleaved CCM PFC Controller, UCC28070, Nov. 2007, revised Jun. 2009, particularly p. 17.

(Continued)

*Primary Examiner* — Douglas W Owens
*Assistant Examiner* — Amy Yang
(74) *Attorney, Agent, or Firm* — Terrile, Cannatti, Chambers & Holland, LLP; Kent B. Chambers

(57) ABSTRACT

Power control systems generate electromagnetic interference (EMI). In at least one embodiment, a power control system includes a switching power converter and a controller that utilizes a spread spectrum strategy to reduce peak EMI values of the power control system. The controller generates a power regulation, switch control signal to control an input voltage to output voltage conversion by the switching power converter. The controller modulates the period of the control signal in accordance with the spread spectrum strategy. The spread spectrum strategy is an intentional plan to spread the spectrum of the control signal to reduce peak EMI values, and, thus, reduce the potential for degradation in performance, a malfunction, or failure of an electronic circuit caused by the EMI. The controller also modulates a pulse width of the switch control signal in response to modulation of the period of the control signal to provide power factor correction.

39 Claims, 9 Drawing Sheets

(56) References Cited

U.S. PATENT DOCUMENTS

| | | |
|---|---|---|
| 3,586,988 A | 6/1971 | Weekes |
| 3,725,804 A | 4/1973 | Langan |
| 4,409,476 A | 10/1983 | Lofgren et al. |
| 4,523,128 A | 6/1985 | Stamm |
| 4,937,728 A | 6/1990 | Leonardi |
| 4,980,898 A | 12/1990 | Silvian |
| 5,001,620 A | 3/1991 | Smith |
| 5,055,746 A | 10/1991 | Hu et al. |
| 5,109,185 A | 4/1992 | Ball |
| 5,121,079 A | 6/1992 | Dargatz |
| 5,264,780 A | 11/1993 | Bruer et al. |
| 5,424,932 A | 6/1995 | Inou et al. |
| 5,479,333 A | 12/1995 | McCambridge et al. |
| 5,589,759 A | 12/1996 | Borgato et al. |
| 5,757,635 A | 5/1998 | Seong |
| 5,764,039 A | 6/1998 | Choi et al. |
| 5,768,111 A | 6/1998 | Zaitsu |
| 5,798,635 A | 8/1998 | Hwang et al. |
| 5,912,812 A | 6/1999 | Moriarty, Jr. |
| 5,946,206 A | 8/1999 | Shimizu et al. |
| 5,960,207 A | 9/1999 | Brown |
| 5,962,989 A | 10/1999 | Baker |
| 6,091,233 A | 7/2000 | Hwang |
| 6,125,046 A | 9/2000 | Jang et al. |
| 6,181,114 B1 | 1/2001 | Hemena et al. |
| 6,229,292 B1 | 5/2001 | Redl et al. |
| 6,343,026 B1 | 1/2002 | Perry |
| 6,366,067 B1 * | 4/2002 | Zhang et al. ............ 323/282 |
| 6,369,525 B1 | 4/2002 | Chang et al. |
| 6,407,514 B1 | 6/2002 | Glaser et al. |
| 6,407,515 B1 | 6/2002 | Hesler |
| 6,469,484 B2 | 10/2002 | L'Hermite et al. |
| 6,531,854 B2 | 3/2003 | Hwang |
| 6,628,106 B1 | 9/2003 | Batarseh et al. |
| 6,646,848 B2 | 11/2003 | Yoshida et al. |
| 6,657,417 B1 | 12/2003 | Hwang |
| 6,688,753 B2 | 2/2004 | Calon et al. |
| 6,724,174 B1 | 4/2004 | Esteves et al. |
| 6,728,117 B2 * | 4/2004 | Schemmann et al. ..... 363/21.12 |
| 6,737,845 B2 | 5/2004 | Hwang |
| 6,756,772 B2 | 6/2004 | McGinnis |
| 6,963,496 B2 | 11/2005 | Bimbaud |
| 6,969,978 B2 * | 11/2005 | Dening ............ 323/282 |
| 6,975,523 B2 | 12/2005 | Kim et al. |
| 6,980,446 B2 | 12/2005 | Simada et al. |
| 7,034,611 B2 | 4/2006 | Oswal et al. |
| 7,072,191 B2 | 7/2006 | Nakao et al. |
| 7,099,163 B1 | 8/2006 | Ying |
| 7,126,288 B2 | 10/2006 | Ribarich et al. |
| 7,180,250 B1 | 2/2007 | Gannon |
| 7,246,919 B2 | 7/2007 | Porchia et al. |
| 7,276,861 B1 | 10/2007 | Shteynberg et al. |
| 7,345,458 B2 | 3/2008 | Kanai et al. |
| 7,375,476 B2 | 5/2008 | Walter et al. |
| 7,388,764 B2 | 6/2008 | Huynh et al. |
| 7,394,210 B2 | 7/2008 | Ashdown |
| 7,511,437 B2 | 3/2009 | Lys et al. |
| 7,583,136 B2 | 9/2009 | Pelly |
| 7,667,986 B2 | 2/2010 | Artusi et al. |
| 7,679,464 B2 * | 3/2010 | Hariton et al. ............ 331/111 |
| 7,710,047 B2 | 5/2010 | Shteynberg et al. |
| 7,719,246 B2 | 5/2010 | Melanson |
| 7,719,248 B1 | 5/2010 | Melanson |
| 7,746,043 B2 | 6/2010 | Melanson |
| 7,746,671 B2 | 6/2010 | Radecker et al. |
| 7,750,738 B2 | 7/2010 | Bach |
| 7,756,896 B1 | 7/2010 | Feingold |
| 7,777,563 B2 | 8/2010 | Midya et al. |
| 7,804,256 B2 | 9/2010 | Melanson |
| 7,804,480 B2 | 9/2010 | Jeon et al. |
| 2002/0065583 A1 | 5/2002 | Okada |
| 2003/0174520 A1 | 9/2003 | Bimbaud |
| 2004/0004465 A1 | 1/2004 | McGinnis |
| 2005/0168492 A1 | 8/2005 | Hekstra et al. |
| 2005/0197952 A1 | 9/2005 | Shea et al. |
| 2005/0222881 A1 | 10/2005 | Booker |
| 2006/0002110 A1 | 1/2006 | Dowling |
| 2006/0116898 A1 | 6/2006 | Peterson |
| 2006/0184414 A1 | 8/2006 | Pappas et al. |
| 2006/0214603 A1 | 9/2006 | Oh et al. |
| 2006/0238136 A1 | 10/2006 | Johnson III et al. |
| 2006/0285365 A1 | 12/2006 | Huynh et al. |
| 2007/0024213 A1 | 2/2007 | Shteynberg et al. |
| 2007/0055564 A1 | 3/2007 | Fourman |
| 2007/0124615 A1 | 5/2007 | Orr |
| 2007/0126656 A1 | 6/2007 | Huang et al. |
| 2007/0285031 A1 | 12/2007 | Shteynberg et al. |
| 2008/0012502 A1 | 1/2008 | Lys |
| 2008/0027841 A1 | 1/2008 | Eder |
| 2008/0043504 A1 | 2/2008 | Ye et al. |
| 2008/0054815 A1 | 3/2008 | Kotikalapoodi et al. |
| 2008/0116818 A1 | 5/2008 | Shteynberg et al. |
| 2008/0130322 A1 | 6/2008 | Artusi et al. |
| 2008/0130336 A1 | 6/2008 | Taguchi |
| 2008/0150433 A1 | 6/2008 | Tsuchida et al. |
| 2008/0154679 A1 | 6/2008 | Wade |
| 2008/0174291 A1 | 7/2008 | Hansson et al. |
| 2008/0175029 A1 | 7/2008 | Jung et al. |
| 2008/0232141 A1 | 9/2008 | Artusi et al. |
| 2008/0239764 A1 | 10/2008 | Jacques et al. |
| 2009/0067204 A1 | 3/2009 | Ye et al. |
| 2009/0070188 A1 | 3/2009 | Scott et al. |
| 2009/0174479 A1 | 7/2009 | Yan et al. |
| 2010/0141317 A1 | 6/2010 | Szajnowski |

FOREIGN PATENT DOCUMENTS

| | | |
|---|---|---|
| EP | 0838791 | 4/1998 |
| EP | 1460775 | 9/2004 |
| EP | 2204905 A1 | 7/2010 |
| GB | 2069269 A | 8/1981 |
| WO | W09725836 | 7/1997 |
| WO | 01/15316 A1 | 1/2001 |
| WO | 02/15386 A2 | 2/2002 |
| WO | W02006013557 | 2/2006 |
| WO | W02008072160 | 6/2008 |
| WO | W020080152838 | 12/2008 |

OTHER PUBLICATIONS http://toolbarpdf.com/docs/functions-and-features-of-inverters.html printed on Jan. 20, 2011.

Texas Instruments, Interleaving Continuous Conduction Mode PFC Controller, UCC28070, SLUS794C, Nov., 2007, revised Jun., 2009, Texas Instruments, Dallas TX.

* cited by examiner

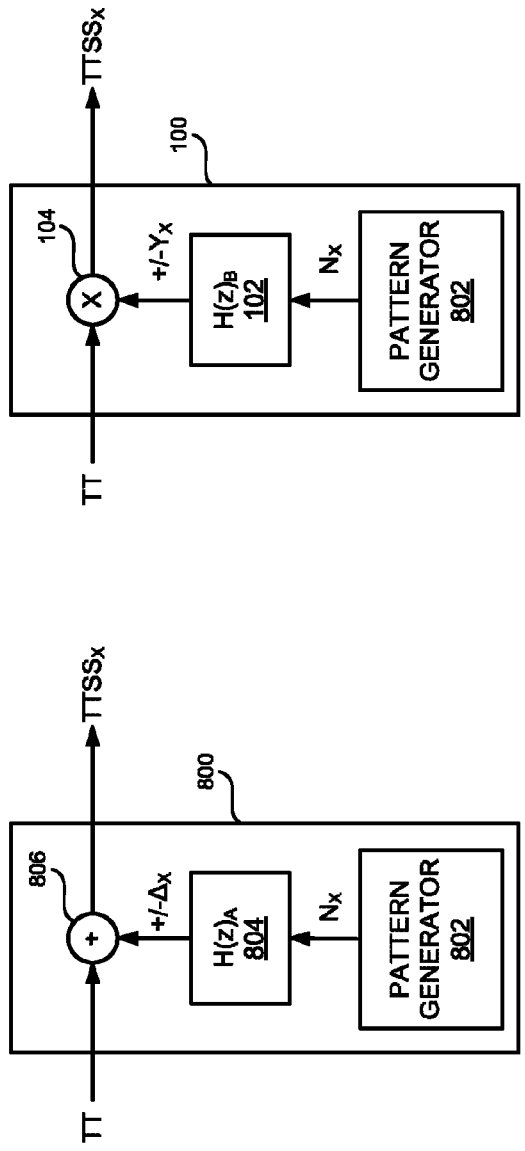
Figure 10
Figure 8
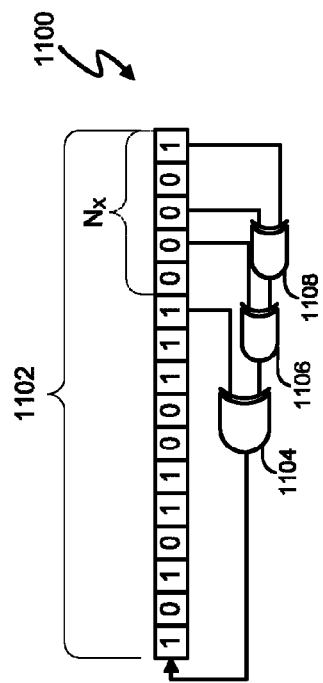
Figure 11

SWITCH POWER CONVERTER CONTROL WITH SPREAD SPECTRUM BASED ELECTROMAGNETIC INTERFERENCE REDUCTION

CROSS-REFERENCE TO RELATED APPLICATION

This application is a continuation-in-part of application Ser. No. 11/967,269, entitled "Power Control System Using a Nonlinear Delta-Sigma Modulator with Nonlinear Power Conversion Process Modeling"; filed Dec. 31, 2007, now U.S. Pat. No. 7,719,246 inventor John L. Melanson, and (referred to herein as "Melanson I"), which claims the benefit under 35 U.S.C. §119(e) of U.S. Provisional Application No. 60/915,547, filed May 2, 2007. Melanson I and U.S. Provisional Application No. 60/915,547 describe exemplary embodiments and are hereby both incorporated by reference in their entireties.

This application is a continuation-in-part of application Ser. No. 11/967,271, entitled "Power Factor Correction Controller with Feedback Reduction", filed Dec. 31, 2007, now U.S. Pat. No. 8,040,703 inventor John L. Melanson, and (referred to herein as "Melanson II"), which claims the benefit under 35 U.S.C. §119(e) of U.S. Provisional Application No. 60/915,547, filed May 2, 2007. Melanson II describes exemplary embodiments and is hereby incorporated by reference in its entirety.

This application is a continuation-in-part of application Ser. No. 11/967,273, entitled "System and Method with Inductor Flyback Detection Using Switch Date Charge Characteristic", filed Dec. 31, 2007, now U.S. Pat. No. 7,746,043 inventor John L. Melanson, and (referred to herein as "Melanson III"), which claims the benefit under 35 U.S.C. §119(e) of U.S. Provisional Application No. 60/915,547, filed May 2, 2007. Melanson III describes exemplary embodiments and is hereby incorporated by reference in its entirety.

This application is a continuation-in-part of application Ser. No. 11/967,275, entitled "Programmable Power Control System", filed Dec. 31, 2007, now U.S. Pat. No. 7,969,125 inventor John L. Melanson, and (referred to herein as "Melanson IV"), which claims the benefit under 35 U.S.C. §119(e) of U.S. Provisional Application No. 60/915,547, filed May 2, 2007. Melanson IV describes exemplary embodiments and is hereby incorporated by reference in its entirety.

This application is a continuation-in-part of application Ser. No. 12/047,262, entitled "Power Control System for Current Regulated Light Sources", filed Mar. 12, 2008, now U.S. Pat. No. 7,804,256 inventor John L. Melanson, and (referred to herein as "Melanson V"), which claims the benefit under 35 U.S.C. §119(e) of U.S. Provisional Application No. 60/894,295, filed Mar. 12, 2007. Melanson V describes exemplary embodiments and is hereby incorporated by reference in its entirety.

BACKGROUND OF THE INVENTION

1. Field of the Invention

The present invention relates in general to the field of signal processing, and, more specifically, to a programmable power control system.

2. Description of the Related Art

Power control systems often utilize a switching power converter to convert alternating current (AC) voltages to direct current (DC) voltages or DC-to-DC. Switching power converters provide power factor corrected and regulated output voltages to many devices that utilize a regulated output voltage. Exemplary devices that utilize a regulated output voltage include lamps, such as light emitting diode and gas discharge type lamps, cellular telephones, computing devices, personal digital assistants, and power supplies.

FIG. 1 represents a power control system 100, which includes a switching power converter 102. Voltage source 101 supplies an alternating current (AC) input voltage $V_A$ to a full, diode bridge rectifier 103. The voltage source 101 is, for example, a public utility, and the AC voltage $V_A$ is, for example, a 60 Hz/110 V line voltage in the United States of America or a 50 Hz/220 V line voltage in Europe. The rectifier 103 rectifies the input voltage $V_A$ and supplies a rectified, time-varying, line input voltage $V_{IN}$ to the switching power converter.

The power control system 100 includes a PFC and output voltage controller 114 to control power factor correction and regulate an output voltage $V_C$ of switching power converter 102. The PFC and output voltage controller 114 controls an ON (i.e. conductive) and OFF (i.e. nonconductive) state of switch 108 by varying a state of pulse width modulated control signal $CS_0$. Switching between states of switch 108 regulates the transfer of energy from the rectified line input voltage $V_{IN}$ through inductor 110 to capacitor 106.

The inductor current $i_L$ is proportionate to the 'on-time' of switch 108. The inductor current $i_L$ ramps 'up' when the switch 108 is ON. The inductor current $i_L$ ramps down when switch 108 is OFF and supplies current $i_L$ to recharge capacitor 106. The time period during which inductor current $i_L$ ramps down is commonly referred to as the "inductor flyback time". During the inductor flyback time, diode 111 is forward biased. Diode 111 prevents reverse current flow into inductor 110 when switch 108 is OFF. In at least one embodiment, the switching power converter 102 operates in discontinuous current mode, i.e. the inductor current $i_L$ ramp up time plus the inductor flyback time is less than the period of the control signal $CS_0$. When operating in continuous conduction mode, the inductor current $i_L$ ramp-up time plus the inductor flyback time equals the period of control signal $CS_0$.

The switch 108 is an n-channel field effect transistor that conducts when the pulse width of control signal $CS_0$ is high. Control signal $CS_0$ is the gate voltage of switch 108. Thus, the 'on-time' of switch 108 is determined by the pulse width of control signal $CS_0$. In at least one embodiment, the energy transferred to inductor 110 is proportionate to a square of the pulse width of control signal $CS_0$.

Capacitor 106 supplies stored energy to load 112. The capacitor 106 is sufficiently large so as to maintain a substantially constant output voltage $V_C$, as established by PFC and output voltage controller 114. The output voltage $V_C$ remains substantially constant during constant load conditions. However, as load conditions change, the output voltage $V_C$ changes. The PFC and output voltage controller 114 responds to the changes in output voltage $V_C$ and adjusts the control signal $CS_0$ to resume a substantially constant output voltage as quickly as possible. The output voltage controller 114 includes a small capacitor 115 to filter any high frequency signals from the line input voltage $V_{IN}$.

In addition to regulating the output voltage $V_C$, PFC and output voltage controller 114 controls switch 108 to provide power factor correction for switching power converter 102. The goal of power factor correction technology is to make the switching power converter 102 appear resistive to the voltage source 101. Thus, the PFC and output voltage controller 114 attempts to control the inductor current $i_L$ so that the average inductor current $i_L$ is linearly and directly related to the line input voltage $V_{IN}$. Prodić, *Compensator Design and Stability Assessment for Fast Voltage Loops of Power Factor Correc-*

*tion Rectifiers*, IEEE Transactions on Power Electronics, Vol. 22, No. 5, September 2007, pp. 1719-1729 (referred to herein as "Prodić"), describes an example of PFC and output voltage controller 114.

The values of the pulse width and duty cycle of control signal $CS_0$ depend on two feedback signals, namely, the line input voltage $V_{IN}$ and the capacitor voltage/output voltage $V_C$. PFC and output controller 114 receives two feedback signals, the line input voltage $V_{IN}$ and the output voltage $V_C$, via a wide bandwidth current loop 116 and a slower voltage loop 118. The line input voltage $V_{IN}$ is sensed from node 120 between the diode rectifier 103 and inductor 110. The output voltage $V_C$ is sensed from node 122 between diode 111 and load 112. The current loop 116 operates at a frequency $f_c$ that is sufficient to allow the PFC and output controller 114 to respond to changes in the line input voltage $V_{IN}$ and cause the inductor current $i_L$ to track the line input voltage to provide power factor correction. The current loop frequency is generally set to a value between 20 kHz and 100 kHz. The voltage loop 118 operates at a much slower frequency $f_v$, typically 10-20 Hz. By operating at 10-20 Hz, the voltage loop 118 functions as a low pass filter to filter an alternating current (AC) ripple component of the output voltage $V_C$.

The PFC and output voltage controller 114 controls the pulse width and period of control signal $CS_0$. PFC and output voltage controller 114 controls switching power converter 102 so that a desired amount of energy is transferred to capacitor 106. The desired amount of energy depends upon the voltage and current requirements of load 112. To regulate the amount of energy transferred and maintain a power factor correction close to one, PFC and output voltage controller 114 varies the period of control signal $CS_0$ so that the input current $i_L$ tracks the changes in input voltage $V_{IN}$ and holds the output voltage $V_C$ constant. Thus, as the input voltage $V_{IN}$ increases, PFC and output voltage controller 114 increases the period of control signal $CS_0$, and as the input voltage $V_{IN}$ decreases, PFC and output voltage controller 114 decreases the period of control signal $CS_0$. At the same time, the pulse width of control signal $CS_0$ is adjusted to maintain a constant duty cycle (D) of control signal $CS_0$, and, thus, hold the output voltage $V_C$ constant. In at least one embodiment, the PFC and output voltage controller 114 updates the control signal $CS_0$ at a frequency much greater than the frequency of input voltage $V_{IN}$. The frequency of input voltage $V_{IN}$ is generally 50-60 Hz. The frequency $f_{SC0}$ of control signal $CS_0$ is, for example, between 25 kHz and 100 kHz. Frequencies at or above 25 kHz avoid audio frequencies, and frequencies at or below 100 kHz avoid significant switching inefficiencies while still maintaining good power factor correction, e.g. between 0.9 and 1, and an approximately constant output voltage $V_C$.

FIG. 2 depicts a frequency spectrum graph 200 of electromagnetic interference (EMI) corresponding to switch control signal $CS_0$. Electromagnetic interference is an electromagnetic disturbance, which can bring about a degradation in performance, a malfunction, or failure of an electronic circuit. The fundamental frequency $f_{SC0}$ is the frequency at which control signal $CS_0$ causes switch 108 to turn ON. For a particular input voltage $V_{IN}$, a constant output voltage $V_C$, and a fundamental frequency $f_{SC0}$ of the control signal $CS_0$, the EMI has a peak 202 at the fundamental frequency $f_{CS0}$, a peak 204 at the second harmonic frequency $2f_{CS0}$, a peak 206 at the third harmonic frequency $3f_{CS0}$, and so on. The control signal $CS_0$ is essentially tonal, i.e. the frequency of the control signal $CS_0$ corresponding to the EMI of FIG. 2 is essentially constant. Any variation in the fundamental frequency $f_{SC0}$ of the control signal $CS_0$ for a particular input voltage $V_{IN}$ is generally relatively small, such as less than 0.5% of the fundamental frequency $f_{SC0}$. Although the EMI is responsive to a tonal control signal $CS_0$, the EMI varies between $f_{SC0+}$ and $f_{SC0-}$. The EMI peak values at the second order and higher order harmonic frequencies decrease as the order of the harmonic frequency increases.

Because of the potential of EMI to interfere with electronic circuits, many governmental entities, such as the United States' Federal Communications Commission (FCC), regulate the amount of EMI that a circuit is allowed to generate. Thus, not only can EMI interfere with electronic circuits, EMI that exceeds regulatory standards can prevent an electronic device, such as PFC and output voltage controller 114 and switching power converter 102, from being legally manufactured and/or operated.

SUMMARY OF THE INVENTION

In one embodiment of the present invention, an apparatus includes a controller to control a switching power converter. The controller is configured to modulate a period of a power regulation, switch control signal for the switching power converter in accordance with a spread spectrum strategy to reduce electromagnetic interference. At least 10% of the electromagnetic interference is above 5 kHz. The controller is further configured to modulate a pulse width of the power regulation, switch control signal in response to modulation of the period to provide power factor correction for the switching power converter.

In another embodiment of the present invention, an apparatus includes a controller to control a switching power converter. The controller includes a period generator to generate a precursor period value of a period of a duty cycle modulated, power regulation, switch control signal. The power regulation, switch control signal is generated to control a switching power converter. The controller further includes a spread spectrum module, coupled to the period generator, to receive the precursor period value, select a step-size value to modify the precursor period value, and modulate the precursor period value with the selected step-size value to generate a varying period of the power regulation, switch control signal and thereby spread a spectrum of the power regulation, switch control signal. The controller further includes a pulse width generator to modulate a pulse width of the power regulation, switch control signal in response to modulation of the period to provide power factor correction for the switching power converter.

In a further embodiment of the invention, a method includes modulating a period of a power regulation, switch control signal for the switching power converter in accordance with a spread spectrum strategy to reduce electromagnetic interference, wherein at least 10% of the electromagnetic interference is above 5 kHz. The method further includes modulating a pulse width of the power regulation, switch control signal in response to modulation of the period to provide power factor correction for the switching power converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 8 depicts an embodiment of the spread spectrum module in FIG. 5.

FIG. 10 depicts another embodiment of the spread spectrum module in FIG. 5.

FIG. 11 depicts a random number generator.

DETAILED DESCRIPTION

Power control systems generate electromagnetic interference (EMI). In at least one embodiment, a power control system includes a switching power converter and a controller that utilizes a spread spectrum strategy to reduce peak EMI values of the power control system. The controller generates a power regulation, switch control signal to control conversion of an input voltage into an output voltage by the switching power converter. In at least one embodiment, the controller modulates a period of the power regulation, switch control signal in accordance with one or more embodiments of the spread spectrum strategy to reduce peak EMI values of the power control system. The spread spectrum strategy is an intentional methodology to spread the spectrum of the power regulation, switch control signal to reduce peak EMI values, and, thus, reduce the potential for degradation in performance, a malfunction, or failure of an electronic circuit caused by the EMI. In at least one embodiment, the controller is also configured to modulate a pulse width of the power regulation, switch control signal in response to modulation of the period of the power regulation, switch control signal to provide power factor correction for the switching power converter.

In at least one embodiment, the controller includes a period generator to generate a precursor period value of a duty cycle modulated, power regulation, switch control signal. In at least one embodiment, the controller also includes a spread spectrum module coupled to the period generator. The spread spectrum module receives the precursor period value and randomly varies the precursor period value to generate a varying period of the power regulation, switch control signal and thereby spread the switching frequency spectrum of the power regulation, switch control signal and the EMI frequency spectrum. Thus, the controller is configured to spread a spectrum of a power regulation, switch control signal for the switching power converter to reduce peak EMI values. In at least one embodiment, the frequency of the power regulation, switch control signal is greater than approximately 20 kHz.

Figure 3:
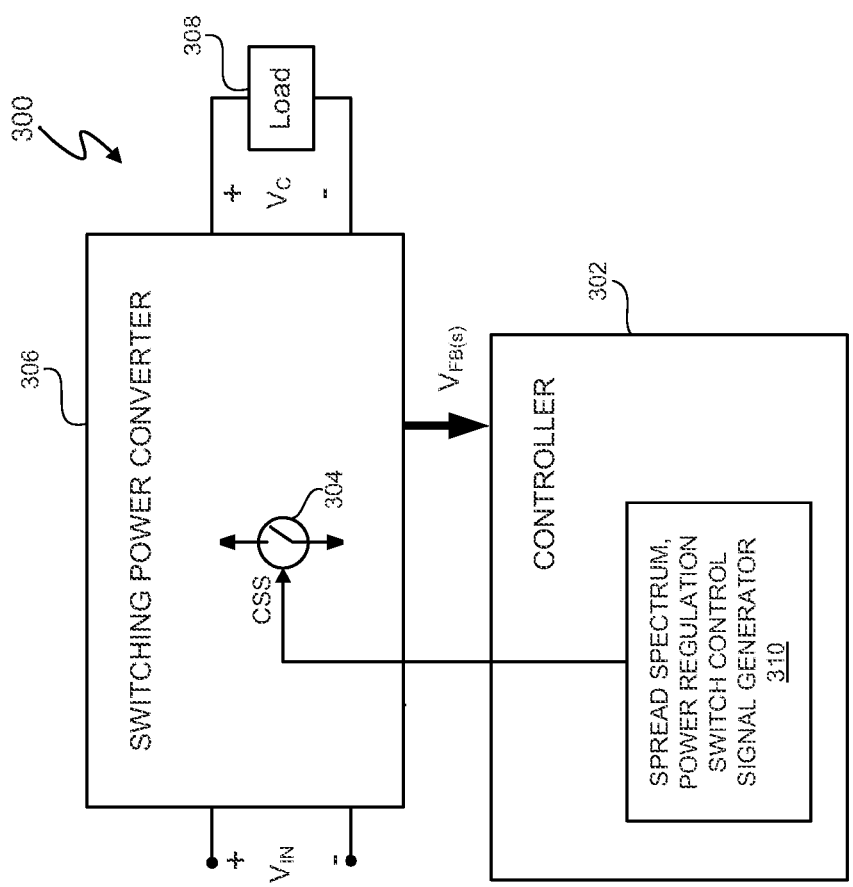
FIG. 3 depicts a power control system that includes a switching power converter controller that includes a spread spectrum, power regulation, switch control signal generator.

FIG. 3 depicts a power control system 300 that includes controller 302. Controller 302 generates a power regulation, switch control signal CSS (also referred to herein as "control signal CSS") to control conductivity of switch 304 of switching power converter 306. Switch 304 controls a conversion of input voltage $V_{IN}$ into an output voltage $V_C$ by switching power converter 306. The particular configuration of switch 304 is a matter of design choice. In at least one embodiments, switch 304 is an n-channel, metal oxide semiconductor field effect transistor (MOSFET) or an insulated gate FET (IG-FET). $V_{IN}$ can be any type of time-varying voltage. In at least one embodiment, input voltage $V_{IN}$ is a rectified, AC voltage, and output voltage $V_C$ is a regulated DC voltage as, for example, described with reference to power control system 100. Load 308 can be any type of load. For example, in at least one embodiment, load 308 is a power supply, such as a DC-DC or DC-AC power supply. Load 308 can also include, for example, a lighting system that includes one or more light emitting diodes or gas discharge lamps. The particular type and configuration of switching power converter 302 is a matter of design choice, such as a boost converter, buck converter, buck-boost converter, or Cúk converter.

Controller 302 includes a spread spectrum, power regulation, switch control signal generator 310 (referred to herein as the "signal generator 310") to generate the control signal CSS in accordance with a spread spectrum strategy. In at least one embodiment, spreading the spectrum of control signal CSS reduces the EMI of switching power converter 306. The type of spectral spreading is a matter of design choice and depends in part on the type of control signal CSS. As subsequently explained in more detail, in at least one embodiment, control signal CSS is a duty cycle modulated signal having a fundamental period $TTSS_X$ and a pulse width $T1_X$. "X" is an index, such as an integer, that identifies specific periods and pulse widths of control signal CSS. The fundamental frequency $f_{SSC}$ of control signal CSS equals $1/TTSS_X$. Thus, "$TTSS_X$" represents the fundamental period value corresponding to the inverse of the fundamental spread spectrum frequency $f_{CSS}$. In at least one embodiment, the signal generator 310 varies the fundamental period $TTSS_X$ for a particular input voltage $V_{IN}$ so that the fundamental frequency $f_{CSS}$ varies, thus, spreading the spectrum of control signal CSS. In at least one embodiment, the signal generator 310 also provides power factor correction for switching power converter 306. In at least one embodiment, the signal generator 310 varies the pulse width T1 of control signal CSS to compensate for variations of the fundamental period $TTSS_X$ and, thus, reduces the EMI of switching power converter 306 while still providing power factor correction. In at least one embodiment, the feedback voltage signal(s) $V_{FB}(s)$ provides information about the input voltage $V_{IN}$ and output voltage $V_C$ to allow controller 302 to generate control signal CSS.

The particular implementation of controller 302 is a matter of design choice. For example, in at least one embodiment, controller 302 is a digital controller and generates the precursor period value TT and the fundamental period value $TTSS_X$ as digital values. In some embodiments, controller 302 is implemented as an integrated circuit, discrete digital components, a combination of an integrated circuit and discrete components, a field programmable gate array, or as code stored in a non-transitory medium and executed by a processor. Examples of non-transitory mediums include hard disk drives, flash memory, and electronically erasable programmable random access memory.

Figure 1:
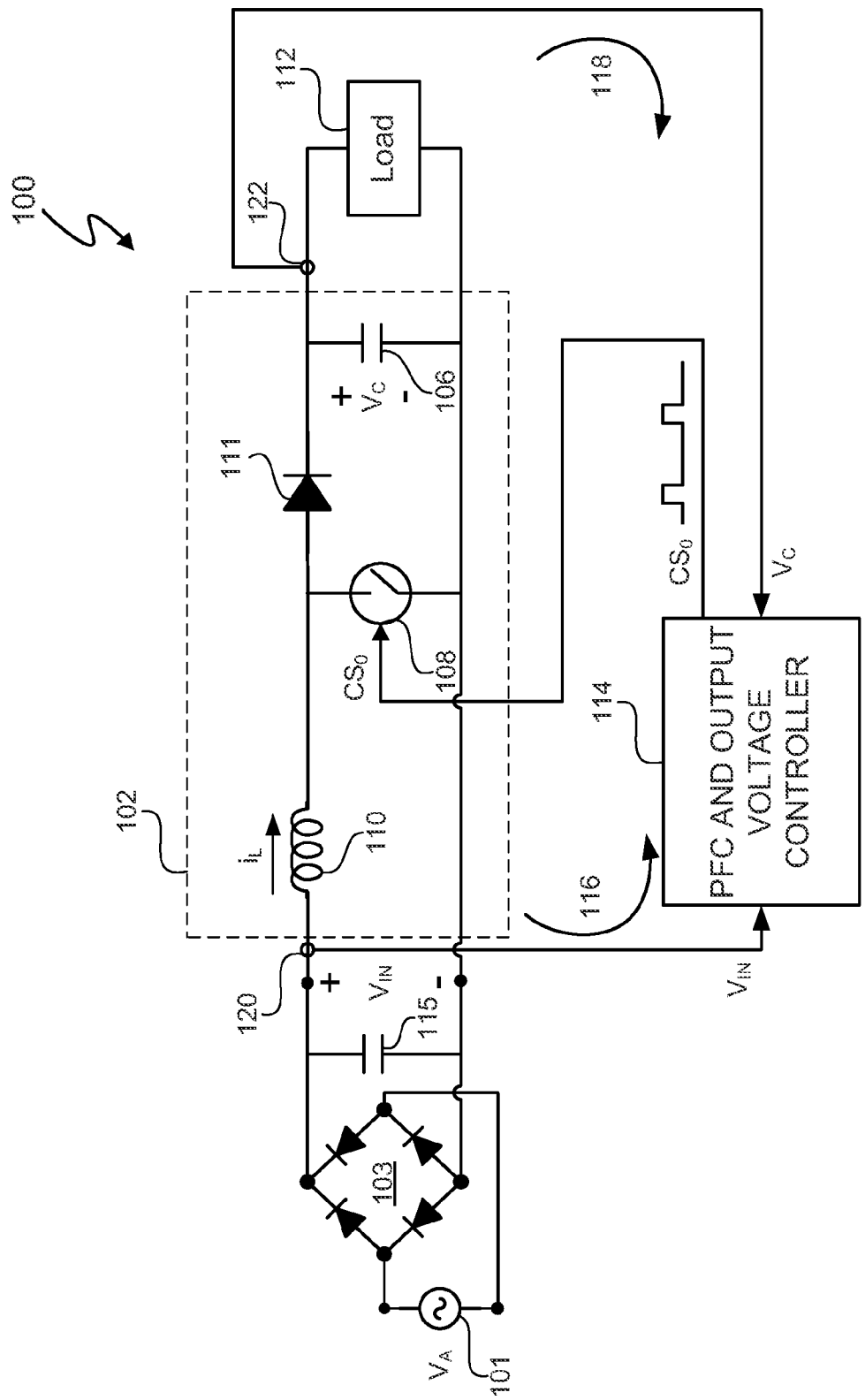
FIG. 1 (labeled prior art) depicts a power control system.
Figure 4:
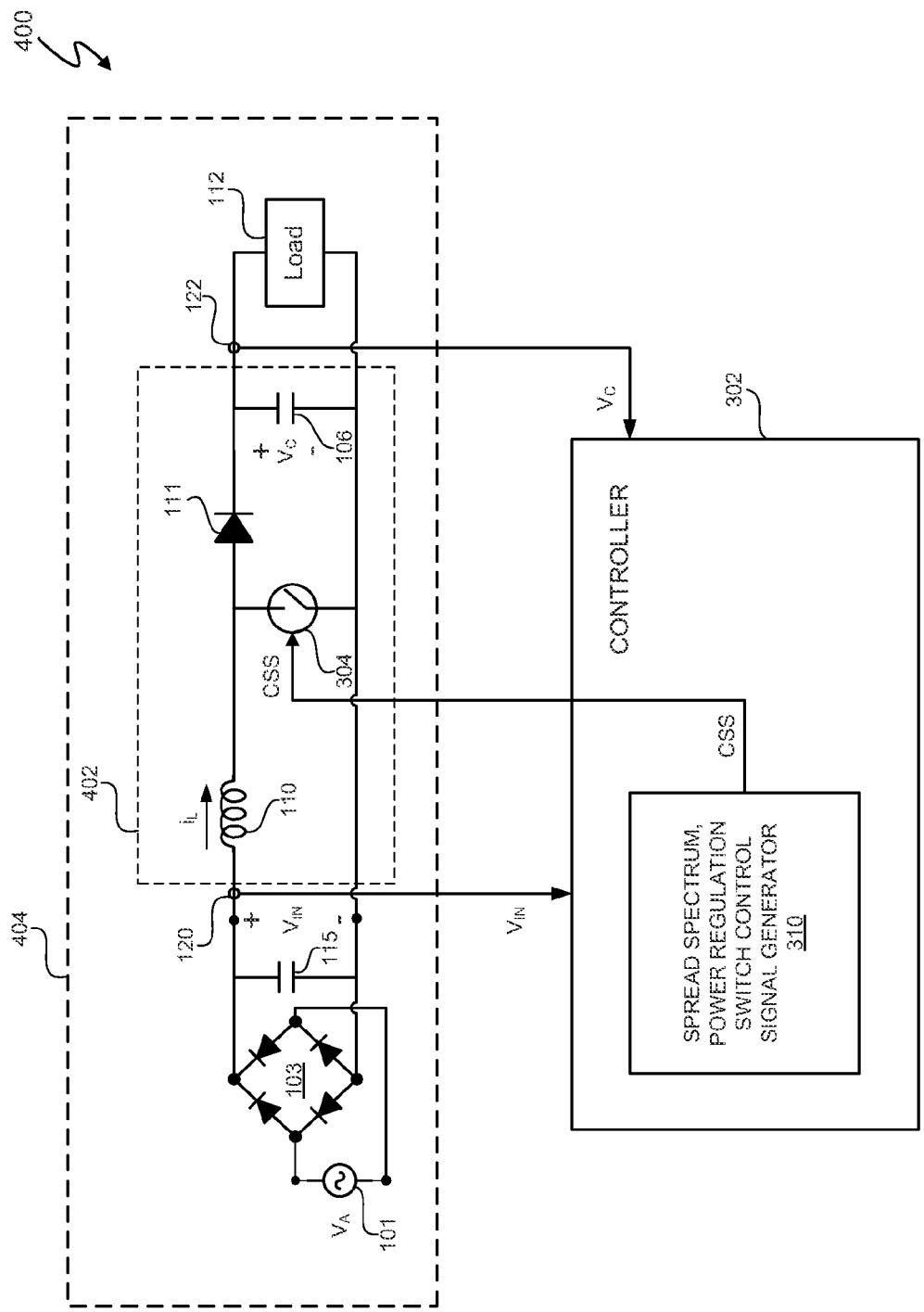
FIG. 4 depicts a power control system having a boost-type switching power converter and a switching power converter controller that includes a spread spectrum, power regulation, switch control signal generator.

FIG. 4 depicts a power control system 400 that includes a boost-type switching power converter 402. Switching power converter 402 represents one embodiment of switching power converter 306. With the exception of the operation of switch 304 in accordance with control signal CSS, the circuitry in block 404 operates as previously described with reference to power control system 100 (FIG. 1). The subsequent descriptions of embodiments of signal generator 310 can be used to operate a variety of switching power converters including switching power converter 402.

Figure 5:
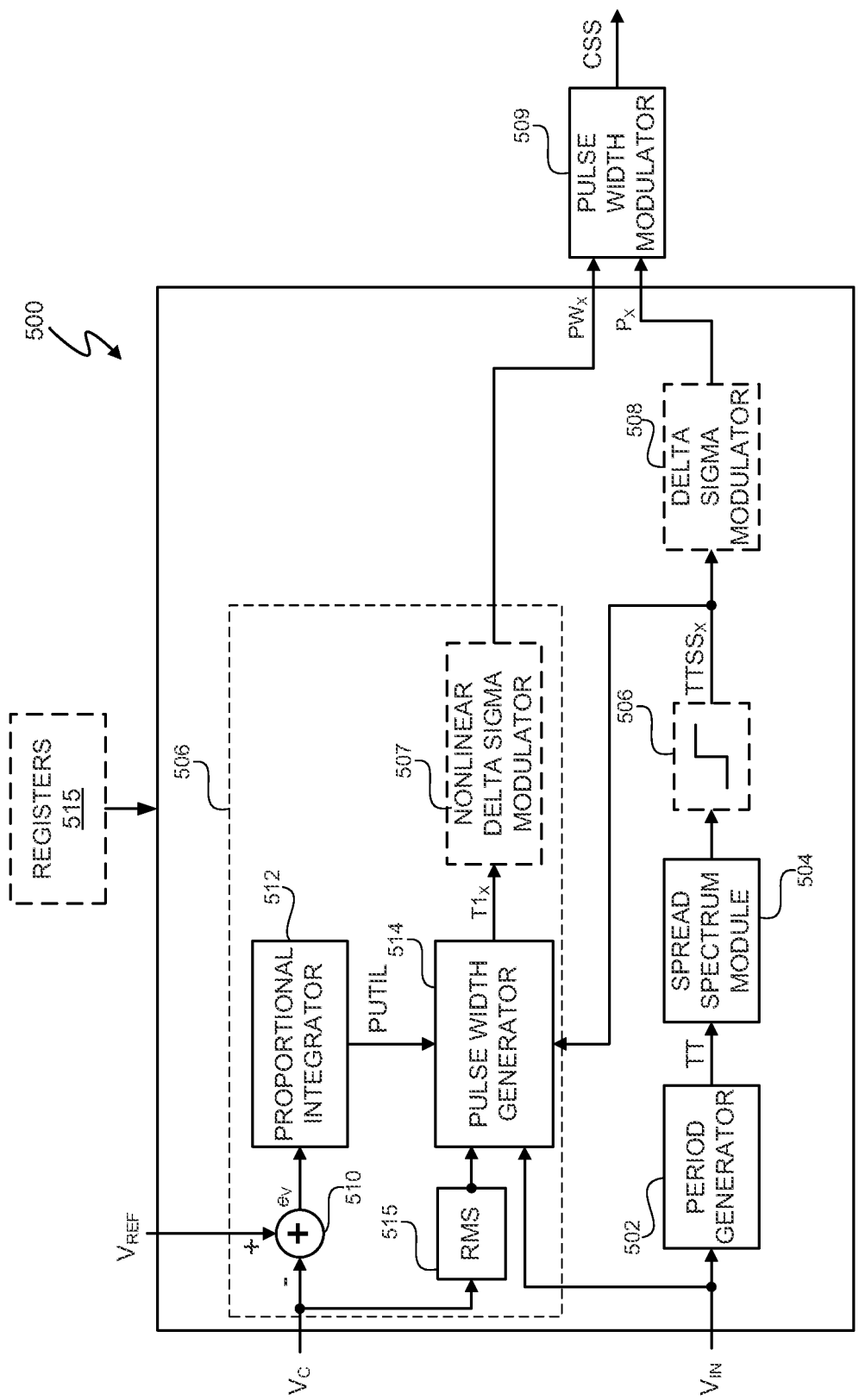
FIG. 5 depicts a spread spectrum signal generator that includes a spread spectrum module.

FIG. 5 depicts a spread spectrum signal generator 500 ("signal generator 500"), which represents one embodiment of signal generator 310. Signal generator 500 includes a period generator 502. The period generator 502 receives input voltage $V_{IN}$ and generates a precursor period value TT. In at least one embodiment, the spread spectrum module included in the signal generator 500 determines the varying fundamental period value $TTSS_X$ of control signal CSS in accordance with a spread spectrum strategy. The particular spread spectrum strategy is a matter of design choice. In general, the spread spectrum strategy varies the precursor period value over time to generate a varying fundamental period value $TTSS_X$, and, thus, the frequency of control signal CSS, using a strategy that reduces peak EMI values generated by, for example, switching power converter 306. The period state signal $P_X$ is identical to the fundamental period value $TTSS_X$ if delta-sigma modulator 508 is not used.

The spread spectrum module 504 is configured in accordance with a spread spectrum strategy to vary the precursor period value TT to generate the fundamental period value $TTSS_X$. In at least one embodiment, signal generator 500 includes a clipper 506 to set a minimum value of the fundamental period value $TTSS_X$ and thereby set a maximum value of the fundamental frequency $f_{CSSX}$ and the second order and above harmonic frequencies of $f_{CSSX}$. The spread spectrum module 504 and optional clipper 506 combine to vary the fundamental period value $TTSS_X$ by a maximum spread of $+/-1/\Delta_{MAX}$. "$\Delta_{MAX}$" represents a maximum frequency variation of the fundamental frequency $f_{CSS}$ by spread spectrum module 504 and, if included, optional clipper 506. In at least one embodiment, the maximum spread $\Delta_{MAX}$ is set to vary the fundamental period value $TTSS_X$ for a given precursor period value TT (and, thus, a given input voltage $V_{IN}$) by an amount that causes the EMI energy generated by power control system 300 (FIG. 3) above 5 kHz to represent at least 10% of the total EMI.

The particular design of spread spectrum module 504 is a matter of design choice. FIGS. 8 and 10, which are subsequently described, depict exemplary embodiments of spread spectrum module 504. In at least one embodiment, spread spectrum module 504 receives the precursor period value TT, and based on the value precursor period value TT, directly selects values of fundamental period value $TTSS_X$ to spread the spectrum of control signal CSS. In this embodiment, the fundamental period value $TTSS_X$ can be stored in a memory in spread spectrum module 504 or in another location, such as in registers 515. In at least one embodiment, the spread spectrum module 504 generates a discrete sequence of digital fundamental period value $TTSS_X$ values.

In at least one embodiment, signal generator 500 also includes an optional delta sigma modulator 508. The delta-sigma modulator 508 receives the fundamental period value $TTSS_X$ and generates the period state signal $P_X$. In this embodiment, the period state signal $P_X$ is an output of delta-sigma modulator 508. The delta-sigma modulator 508 spectrally noise shapes the fundamental period value $TTSS_X$. Spectral noise shaping reduces the influence of noise on the fundamental period value $TTSS_X$ and, thus, allows signal generator 500 to provide better power factor correction and output voltage regulation control for switching power converter 306. Exemplary conventional delta-sigma modulator design and operation is described in the book *Understanding Delta-Sigma Data Converters* by Schreier and Temes, IEEE Press, 2005, ISBN 0-471-46585-2. In at least one embodiment, the signal generator 500 does not include the delta-sigma modulator 508, and the spread spectrum module 504 and optional clipper 506 provide the fundamental period value $TTSS_X$ directly to the pulse width generator 514.

When the delta-sigma modulator 508 is included as part of signal generator 500, the period state signal $P_X$ is a representation of the fundamental period value $TTSS_X$ as generated by the delta-sigma modulator 508. Thus, in these embodiments, the signal generator 500 generates the period state signal $P_X$ in accordance with the spread spectrum strategy to spread the frequency spectrum of control signal CSS. For example, the period control system 504 can generate the value of period state signal $P_X$ within minimum and maximum control signal frequency operational parameters.

Pulse width control system 506 determines a pulse width of control signal CSS so that control signal CSS tracks the line input voltage $V_{IN}$ and minimizes any difference between the output voltage $V_C$ and the reference voltage $V_{REF}$. An error generator 510 determines an error signal $e_v$ between the reference voltage $V_{REF}$ and the output voltage $V_C$ by subtracting the output voltage $V_C$ from the reference voltage $V_{REF}$. The reference voltage $V_{REF}$ is set to a desired voltage level of output voltage $V_C$. A proportional integrator 512 processes the error signal $e_v$ to generate proportional-integral, power utilization signal PUTIL. The proportional integrator 512 adjusts the rate of response of signal generator 500 to changes in the output voltage $V_C$. The power utilization signal PUTIL reflects the rate adjustment. If the response is too slow, then the output voltage $V_C$ may fail to track changes in power demand of load 112 (FIG. 4) and, thus, fail to maintain an approximately constant value. If the response is too fast, then the output voltage $V_C$ may react to minor, brief fluctuations in the power demand of load 112 (FIG. 4). Such fast reactions could cause oscillations in signal generator 500, damage or reduce the longevity of components, or both. Thus, the particular rate of response by proportional integrator 512 is a design choice. An exemplary embodiment of proportional integrator 512 is described in Melanson I and Melanson IV.

The signal generator 500 also modulates the pulse width of the control signal CSS in response to modulation of the period of the control signal CSS to provide power factor correction for the switching power converter 402 (FIG. 4). The pulse width control system 506 also includes a pulse width generator 514 to determine a varying pulse width control value $T1_X$. The pulse width generator 514 generates the pulse width control value $T1_X$ so that the duty cycle of control signal $CS_1$ tracks the line input voltage $V_{IN}$ and responds to modulation of the fundamental period value $TTSS_X$ to, thus, provide power factor correction for switching power converter 402. In at least one embodiment, the pulse width control value $T1_X$ of control signal $CS_1$ is determined in accordance with Control Signal State Equation [1]:

$$T1_X^2 = \frac{2 \cdot L}{V_{rms}^2} \cdot PUTIL \cdot TTSS_X \cdot \left(1 - \frac{V_x}{V_c}\right). \quad [1]$$

"T1" is the pulse width of the control signal $CS_1$ as represented by pulse width state signal $PW_X$. "L" represents an inductor value of inductor 110 of switching power converter 402. "$V_{rms}$" represents the root mean square (RMS) of line input voltage $V_{IN}$ as generated by RMS module 515. PUTIL represents the output of the proportional integrator 512. "$TTSS_X$" is the period of control signal CSS. In at least one embodiment, fundamental period value $TTSS_X$ is the period state signal $P_X$. "$V_{IN}$" is a sampled current value of the line input voltage $V_{IN}$. "$V_C$" is a sampled current value of the output voltage $V_C$ used to generate the power utilization signal PUTIL. Thus, the, in accordance with Equation [1], the pulse width control value $T1_X$ tracks the line input voltage $V_{IN}$ and responds to modulation of the fundamental period value $TTSS_X$ to, thus, provide power factor correction for switching power converter 402.

In at least one embodiment, the pulse width control system 506 uses state equation configuration profile parameters stored in optional registers 515 to respond to any number of exigencies as described in more detail in Melanson IV. Exemplary configuration profile parameters are a minimum pulse width parameter, the value of fundamental period value $TTSS_X$ corresponding to the fundamental spread spectrum frequency $f_{SSX}$, and the maximum spread $\Delta_{MAX}$. Additional configuration profile parameters are described in more detail in Melanson IV.

In at least one embodiment, pulse width control system 506 also optionally includes a nonlinear delta-sigma modulator 507. The nonlinear portion of the conversion of the input voltage $V_{IN}$ to the output voltage $V_C$ by switching power converter 402 is associated with the energy provided to inductor 110 (FIG. 4). The pulse width of control signal CSS and the relation of the pulse width to the period of control signal CSS, i.e. the duty cycle of control signal CSS, controls power factor correction. Accordingly, the nonlinear delta-sigma modulator 507 can be used by pulse width control system 506 to spectrally noise shape the pulse width control value $T1_X$. The nonlinear delta-sigma modulator 507 generates the pulse width state signal $PW_X$ as a quantizer output signal. By removing the influence of noise from a baseband of control signal CSS, the control signal CSS exercises improved control over switching power converter 306. Exemplary embodiments of the nonlinear delta-sigma modulator 507 are described in Melanson I and Melanson IV.

In at least one embodiment, the switching power converters 306 (FIG. 3) and 402 (FIG. 4) operate in discontinuous current mode (DCM). When operating in discontinuous current mode, the period generator 508 ensures that the period of control signal CSS exceeds the ramp-up and ramp-down times of inductor current $i_L$. Melanson IV discusses setting the value of inductor 110 to ensure DCM operation.

Figure 6:
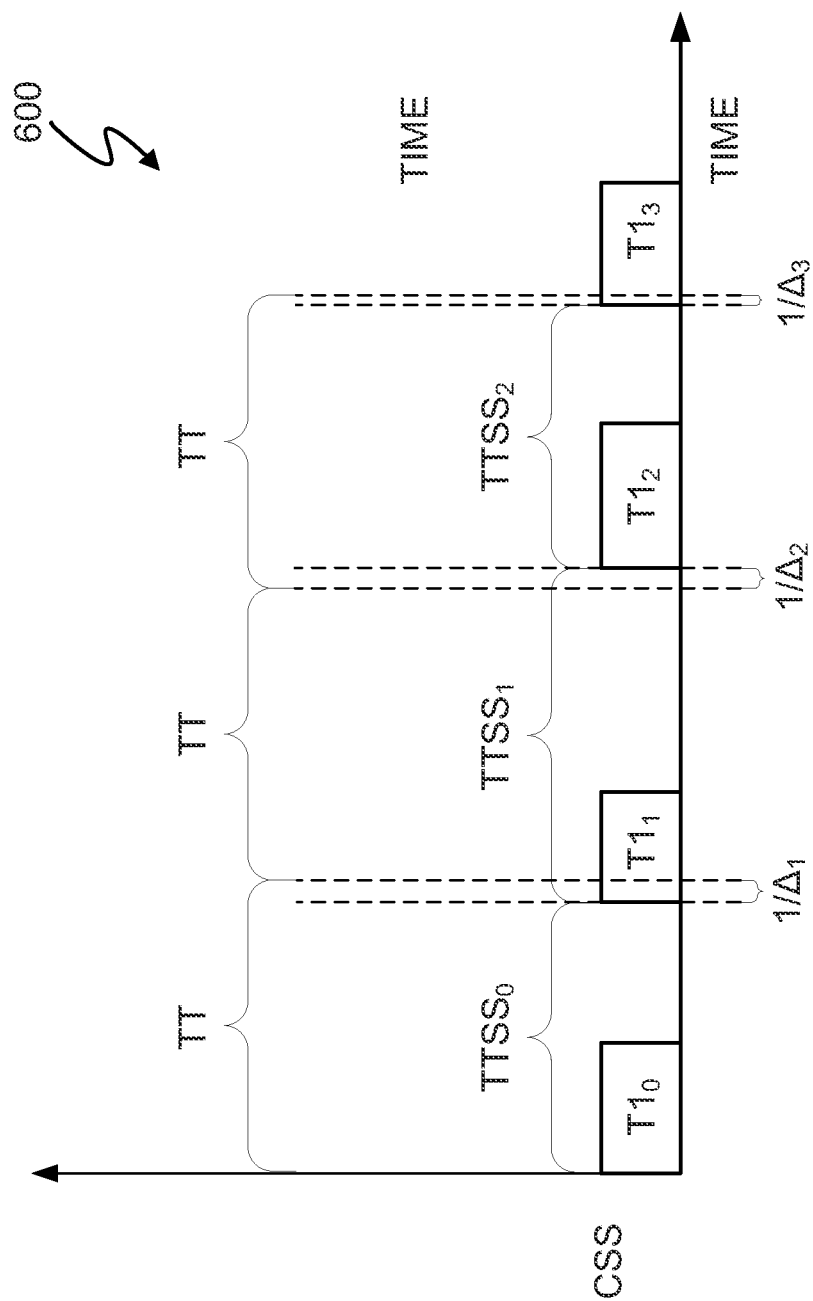
FIG. 6 depicts period timing diagrams that depict exemplary values of a precursor period value and the resultant spread spectrum period value as generated by the spread spectrum module in FIG. 5.

FIG. 6 depicts period timing diagrams 600 that depict exemplary values of the precursor period value TT and the resultant fundamental period value $TTSS_X$ as generated by the spread spectrum module 504. Referring to FIGS. 5 and 6, the values of precursor period value TT, pulse width value $T1_X$, and fundamental period value $TTSS_X$ are depicted for visualization of the variation of fundamental period value $TTSS_X$ relative to the precursor period value TT and are not necessarily drawn to scale. In the timing diagrams 600, the precursor period value TT remains constant during the three (3) depicted cycles of control signal CSS. The spread spectrum module 504 decreases the precursor period value TT by $1/\Delta_1$ to generate fundamental period value $TTSS_1$, increases the precursor period value TT by $1/\Delta_2$ to generate fundamental period value $TTSS_2$, decreases the precursor period value TT by $1/\Delta_3$ to generate fundamental period value $TTSS_3$, and so on. "$1/\Delta_X$" represents an amount by which the fundamental period value $TTSS_X$ is spread relative to the precursor period value TT, and "$1/\Delta_X$" represents a step-size value that is an amount by which each harmonic of the fundamental period value $TTSS_X$ spread. "$\Delta_X$" represents a step-size value that is an amount by which each harmonic of the fundamental frequency $f_{CSS}$ is spread.

The change from $1/\Delta_X$ to $1/\Delta_{X+1}$ represents a step-size. For example, if $1/\Delta_1$ is 14 µsec, $1/\Delta_2$ is 3 µsec, and $1/\Delta_3$ is 20 µsec, the respective step-sizes are 11 µsec and 17 µsec. If $1/\Delta_{X+1} - 1/\Delta_X$ is a constant, then the step-sizes are regular. If $1/\Delta_{X+1} - 1/\Delta_X$ varies, the step-sizes are irregular. In at least one embodiment, a minimum $\Delta_X$ ($\Delta_{X\_MIN}$) varies from a maximum $\Delta_X$ ($\Delta_{X\_MAX}$) by at least 10%, i.e. $100\% \cdot (\Delta_{X\_MAX} - \Delta_{X\_MIN})/\Delta_{X\_MIN} \geq 10\%$. If the step-size value $1/\Delta_X$ is added to the precursor period value, the fundamental period value $TTSS_X$ increases. If the step-size value $\Delta_X$ is subtracted from the precursor period value, the fundamental period value $TTSS_X$ decreases.

Figure 2:
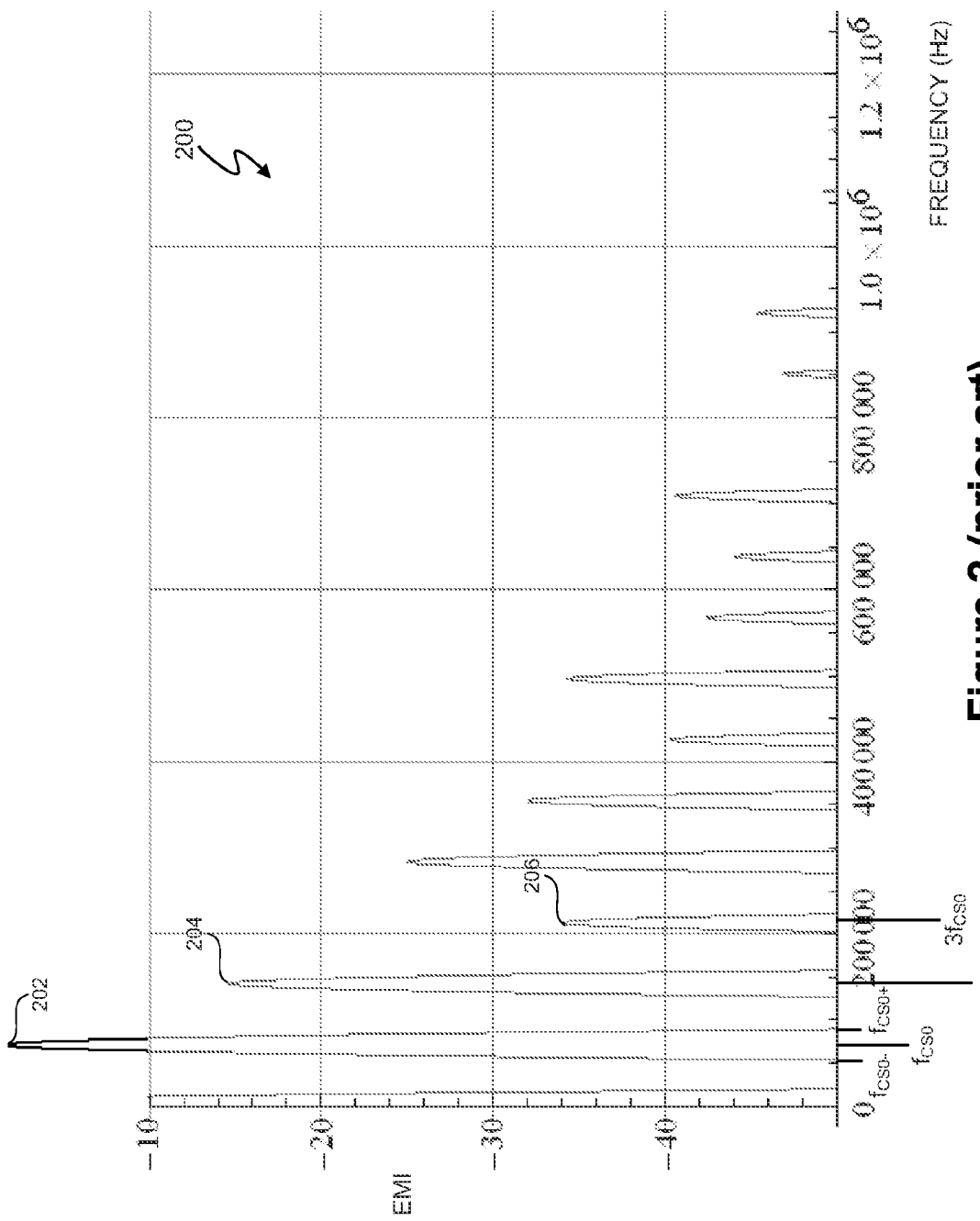
FIG. 2 (labeled prior art) depicts a frequency spectrum graph of electromagnetic interference corresponding to a switch control signal of the power control system of FIG. 1.
Figure 7:
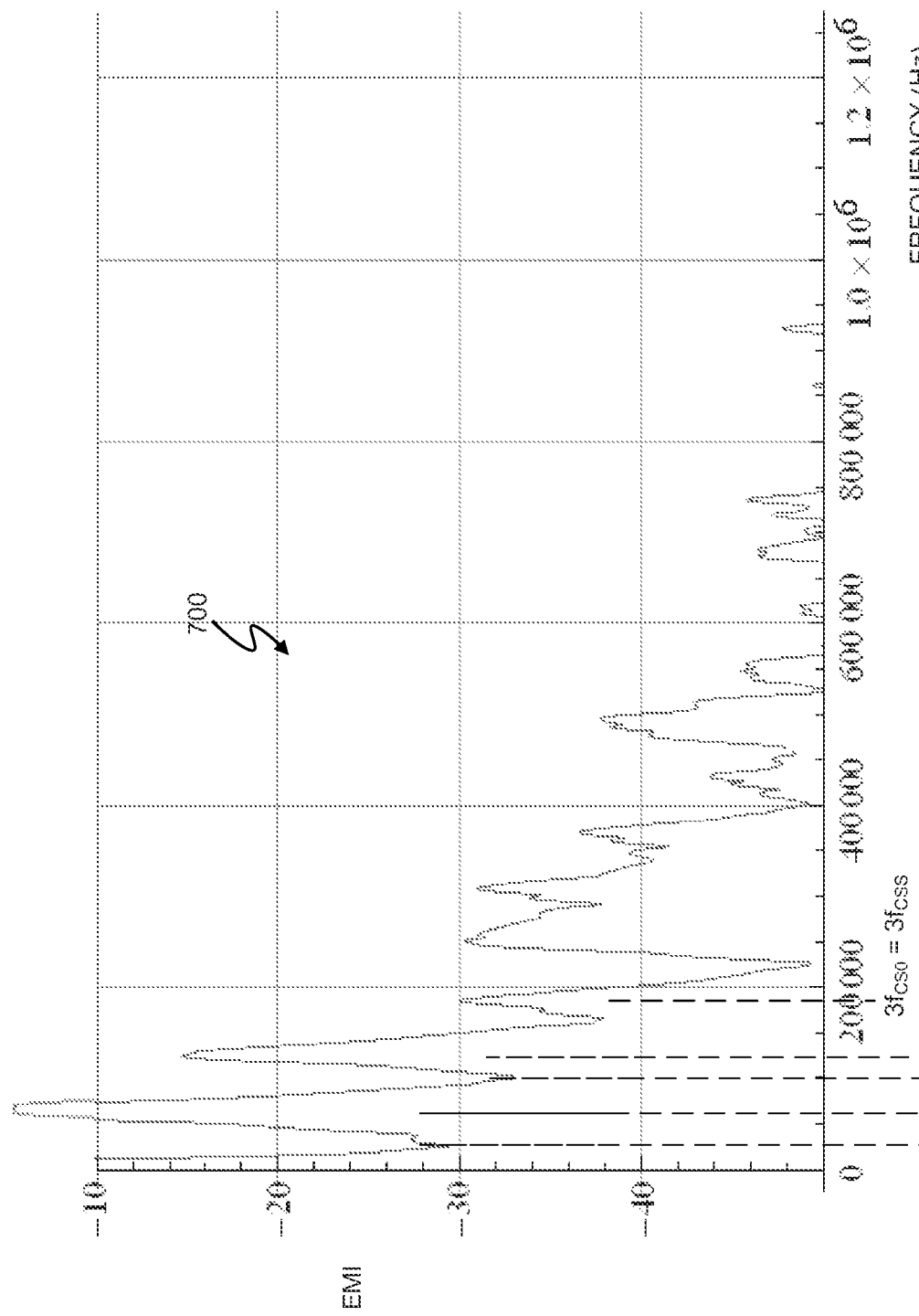
FIG. 7 depicts a frequency spectrum graph 700 of EMI values corresponding to spectral spreading of a power regulation, switch control signal using non-random, irregular step-size values.

FIG. 7 depicts an exemplary frequency spectrum graph 700 of EMI values corresponding to a spread spectrum control signal CSS using a nonrandom pattern of irregular step-sizes $\Delta_X$. Referring to FIGS. 5 and 7, spread spectrum module 504 varies the fundamental period value $TTSS_X$ for a particular input voltage $V_{IN}$ and, thus, spreads the spectrum of control signal CSS. The spectrum of control signal CSS is spread between ($f_{CSS} - \Delta_{MAX}$) and ($f_{CSS} + \Delta_{MAX}$). Spreading the spectrum e. of control signal CSS also spreads the spectrum of EMI corresponding to control signal CSS. In FIG. 7, the maximum spread $\Delta_{MAX}$ is set to vary the fundamental period value $TTSS_X$ for a given precursor period value TT by an amount that causes the EMI energy generated by power control system 300 (FIG. 3) above 5 kHz to vary by at least 10%. Spreading the EMI spectrum reduces the peak EMI values for at least some of the harmonic frequencies of control signal CSS. For example, comparing the EMI of FIG. 2 (prior art) and the EMI in FIG. 7, the maximum magnitude of the third harmonic frequency $3f_{CSS}$ is −29.97 dB (FIG. 7), and the magnitude of the third harmonic frequency $3f_{SCO}$ is −24.82 dB (FIG. 2) for maximum $3f_{CSS} = 3f_{SCO} \approx 190$ kHz. Thus, spectral spreading of the control signal CSS using the nonrandom pattern of irregular step-sizes $\Delta_X$ reduced EMI at the third harmonic frequency by over 5 dB. Reducing the peak EMI values reduces the potential for degradation in performance, a malfunction, or failure of an electronic circuit caused by the EMI. The maximum spread $\Delta_{MAX}$ used to generate the frequency spectrum graph 700 is set to vary the fundamental period value $TTSS_X$ for a given precursor period value TT (and, thus, a given input voltage $V_{IN}$) by an amount that causes the EMI energy generated by power control system 300 (FIG. 3) above 5 kHz to represent at least 10% of the total EMI.

Referring to FIGS. 5, 6, and 7, the particular precursor fundamental frequency $f_{CSS}$ and, thus, the precursor period value TT ($f_{CS} = 1/TT$), is a matter of design choice. The particular maximum frequency spread $\Delta_{MAX}$ is also a matter of design choice. In at least one embodiment, the maximum frequency spread $\Delta_{MAX}$ is within the range of 5-10% of the fundamental frequency $f_{CCS}$.

In at least one embodiment, the signal generator 500 is configured to reduce peak EMI values at frequencies that are regulated by a governmental agency, such as the FCC. For example, if the peak EMI values are regulated above a 150 kHz threshold, in at least one embodiment, the fundamental frequency $f_{CSS}$ and the maximum spread $\Delta_{MAX}$ are set so that $2f_{CS} + \Delta_{MAX}$ is less than or equal to 150 kHz while still avoiding audio frequencies. Additionally, in at least one embodiment, the maximum frequency spread $\Delta_{MAX}$ is set to avoid any potential overlap between the spread spectrum frequency $f_{CCS}$ and the second harmonic spread spectrum frequency $2f_{CSS}$, i.e. $(f_{CCS}+\Delta_{MAX})<(2f_{CCS}-\Delta_{MAX})$. Thus, in at least one embodiment, the fundamental frequency $f_{CCS}$ is set to 61.5 kHz and maximum spread $\Delta_{MAX}$ is set to 17 kHz, so that the spread spectrum frequency $f_{CSSX}$, which equals $1/TTSS_X$, varies between 53 kHz and 70 kHz and the second harmonic spread spectrum frequency $2f_{CSSX}$, which equals $\frac{1}{2}TTSS_X$, varies between 106 kHz and 140 kHz. In at least one embodiment, setting the precursor fundamental frequency $f_{CS}$ is set to 61.5 kHz ($TTSS_X \approx 16.26$ µsec) and maximum spread $\Delta_{MAX}$ is set to 17 kHz ($1/\Delta_{MAX} 5.882$ µsec) places only the third and subsequent harmonic frequencies of control signal CSS, which have decreasing peak EMI values, above the regulated 150 kHz threshold value. In at least one embodiment, the fundamental period value $TTSS_X$ ranges from 14-19 µsecs. The particular precursor fundamental frequency $f_{CSS}$ and, thus, the precursor period value TT ($f_{CS}=1/TT$), is a matter of design choice. In at least one embodiment, the precursor fundamental frequency is set above 2 kHz, and, in at least one embodiment, the precursor fundamental frequency $f_{CS}$ is set up above 25 kHz+maximum spread $\Delta_{MAX}$ to avoid the upper frequency limit of the human perceptible audio frequency spectrum. A maximum spread spectrum frequency $f_{SSX}$ below 150 kHz results in a more efficient operation of switch 304.

FIG. 8 depicts spread spectrum module 800, which represents one embodiment of spread spectrum module 504. In general, the spread spectrum module dithers the precursor period value TT to vary the fundamental period value $TTSS_X$ by adding or subtracting a step-size value $\Delta_X$ to the precursor period value TT. The spread spectrum module 800 includes a pattern generator 802 to generate pattern values $N_X$ for each generation of the precursor period value TT. In at least one embodiment, the pattern value $N_X$ is the step-size value $\Delta_X$ or a scaled value of the step-size value $\Delta_X$. A function generator 804 applies a transfer function $H(z)_A$ to modify an internal function (not shown) by the pattern value $N_X$ to generate the step-size value $\Delta_X$. In at least one embodiment, if the pattern value $N_X$ equals $\Delta_X$, the transfer function $H(z)_A$ directly passes step-size value $\Delta_X$ or passes a negative of the step-size value $\Delta_X$. The adder 806 combines the precursor period value TT with plus or minus the step-size value $\Delta_X$ to generate the fundamental period value $TTSS_X$, i.e. $TTSS_X=+/-\Delta_X$. Thus, the pattern generator 802 and transfer function $H(z)_A$ are configured to vary the fundamental period value $TTSS_X$ by the precursor period value $TT+/-1/\Delta_{MAX}$. The optional clipper 506 is designed to ensure that fundamental period value $TTSS_X$ stays within the range of $TT+/-1/\Delta_{MAX}$.

The type of pattern generator 802 is a matter of design choice. For example, the pattern generator 802 can be configured to generate random and/or nonrandom patterns with regular or irregular step-sizes between successive values of pattern value $N_X$. In at least one embodiment, the pattern generator 802 is a nonrandom number generator that generates pattern value $N_X$, and transfer function $H(z)_A=1=\Delta_X/N_X$, i.e. function generator 804 passes pattern value $N_X$ without modification. In at least one embodiment, the pattern generator 802 includes a memory, and the pattern generator 802 selects pattern values $N_X$ using, for example, a look-up table or any other type of data structure.

Referring to FIGS. 7 and 8, Table 1 contains a discrete sequence of values of a nonrandom, irregular step-size pattern was used by spread spectrum module 800 to generate the frequency spectrum graph 700 of FIG. 7 for precursor period value TT=15.58 µsec. In at least one embodiment, the fundamental period value $TTSS_X$ values are actually a sequence of binary values. Values of fundamental period value $TTSS_X$ that are less than the precursor period TT indicate that $TTSS_X=TT-\Delta_X$, and values of fundamental period value $TTSS_X$ that are more than the precursor period TT indicate that $TTSS_X=TT+\Delta_X$:

TABLE 1

| $N_X = \Delta_X$ | $TTSS_X = P_X$ (µsec) | $f_{CSSX}$ (kHz) |
|---|---|---|
| 0.32 | 15.9 | 62.89 |
| 1.28 | 14.3 | 69.93 |
| 0.82 | 16.4 | 60.98 |
| 0.28 | 15.3 | 65.36 |
| 0.18 | 15.4 | 64.94 |
| 0.62 | 16.2 | 61.73 |
| 0.42 | 16.0 | 62.5 |
| 0.28 | 15.3 | 65.36 |
| 0.18 | 15.4 | 64.94 |
| 0.72 | 16.3 | 61.35 |
| 1.58 | 14.0 | 71.43 |
| 0.42 | 16.0 | 62.5 |
| 0.48 | 15.1 | 66.23 |
| 1.38 | 14.2 | 70.42 |
| 0.12 | 15.7 | 63.69 |
| 0.82 | 16.4 | 60.98 |
| 0.42 | 16.0 | 62.5 |
| 0.92 | 16.5 | 60.61 |

In at least one embodiment, the spread spectrum module 504 (FIG. 5) for the precursor period value TT 15.58 µsec spread spectrum module 504 directly selects values of fundamental period value $TTSS_X$ in the second column of Table 1 from a memory, such as registers 515, to spread the spectrum of control signal CSS. In at least one embodiment, the values of fundamental period value $TTSS_X$ for multiple values of precursor value TT are pre-stored in a memory, such as registers 515, and selected by spread spectrum module 504.

Figure 9:
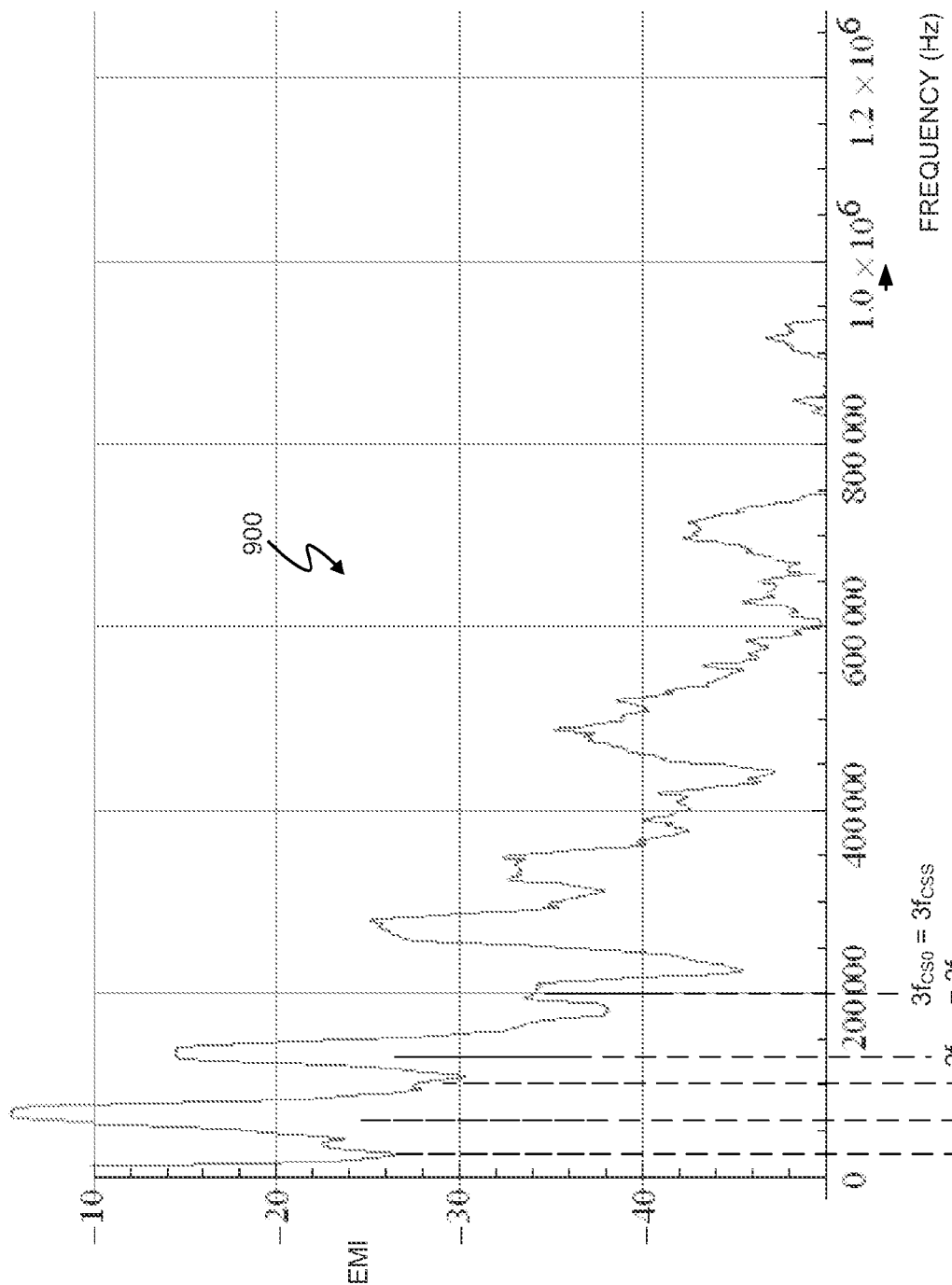
FIG. 9 depicts a frequency spectrum graph 700 of EMI values corresponding to spectral spreading of a power regulation, switch control signal using random, irregular step-size values.

FIG. 9 depicts an exemplary frequency spectrum graph 900 of EMI values corresponding to a spread spectrum control signal CSS using a random pattern of irregular step-sizes $\Delta_X$. Referring to FIGS. 8 and 9, in one embodiment, the pattern generator 802 is a random number generator and randomly varies pattern value $N_X$. Comparing the EMI of FIG. 2 (prior art) and the EMI in FIG. 7, the maximum magnitude of the third harmonic frequency $3f_{CSS}$ is −25.130 dB (FIG. 9), and the magnitude of the third harmonic frequency $3f_{SC0}$ is −24.822 dB (FIG. 2) for maximum $3f_{CSS}=3f_{SC0}\approx 190$ kHz. Thus, spectral spreading of the control signal CSS using the nonrandom pattern of irregular step-sizes $\Delta_X$ reduced EMI at the third harmonic frequency by over 0.3 dB. The maximum spread $\Delta_{MAX}$ used to generate the frequency spectrum graph 900 is set to vary the fundamental period value $TTSS_X$ for a given precursor period value TT (and, thus, a given input voltage $V_{IN}$) by an amount that causes the EMI energy generated by power control system 300 (FIG. 3) above 5 kHz to represent at least 10% of the total EMI.

FIG. 10 depicts spread spectrum module 1000, which represents another embodiment of spread spectrum module 504. Spread spectrum module 1000 functions similarly to spread spectrum module 800 except that function generator 1002 utilizes a function $H(z)_B$ to generate an output value $Y_X$ using the pattern value $N_X$, and spread spectrum module 1000 multiplies the precursor period value TT by the pattern value $N_X$ to generate the fundamental period value $TTSS_X$.

FIG. 11 depicts a 16-bit Fibonacci linear feedback shift register ("LFSR") 1100. In general, LFSR 1100 is a shift register whose input bit is a linear function of its previous state. LFSR 1100 represents one embodiment of the pattern generator 802 as a random number generator. The LFSR 1100 includes a 16-bit shift register 1002, which is preloaded with sixteen binary values such as 1010110011100001. Exclusive OR ("XOR") logic gates 1104 and 1106 each receives one input value from shift register 1102 and an output value from respective XOR logic gate 1106 and 1108. XOR logic gate 1108 receives two values from shift register 1102. In at least one embodiment, the LFSR 1100 operates at the frequency of the spread spectrum frequency $f_{CSSX}$ to generate a random pattern value $P_X$ for each generation of a precursor period value TT. The random pattern value $P_X$ is selected from any combination of bits from the shift register 1102, such as the five (5) least significant bits as shown with the dashed bracket.

Thus, a power control system varies a fundamental frequency of a power regulation, switch control signal programmable to reduce peak EMI values of the power control system. In at least one embodiment, the power control system utilizes a spread spectrum strategy implemented in a spread spectrum module to modulate a period of a precursor period value to effectively spread the spectrum of the power regulation, switch control signal.

Although the present invention has been described in detail, it should be understood that various changes, substitutions and alterations can be made hereto without departing from the spirit and scope of the invention as defined by the appended claims.

What is claimed is:

1. An apparatus comprising:
   a controller to control a switching power converter, wherein the controller is configured to:
   modulate a period of a power regulation, switch control signal for the switching power converter in accordance with a spread spectrum strategy to reduce electromagnetic interference, wherein at least 10% of the electromagnetic interference is above 5 kHz; and
   modulate a pulse width of the power regulation, switch control signal in response to modulation of the period to provide power factor correction for the switching power converter.

2. The apparatus of claim 1 wherein the spread spectrum strategy comprises modulating the period using irregular frequency changes.

3. The apparatus of claim 1 wherein the spread spectrum strategy comprises modulating the period using an spectrum spreading pattern having irregular step-size values for a particular precursor period, and a minimum and maximum of the irregular step-size values vary from each other by at least 10%.

4. The apparatus of claim 3 wherein the controller is further configured to generate the irregular spectrum spreading pattern using a nonrandom spectrum spreading pattern.

5. The apparatus of claim 3 wherein the controller is further configured to generate the irregular spectrum spreading pattern using a random number generator.

6. The apparatus of claim 1 wherein the controller is configured to reduce the electromagnetic interference of the switching power converter in at least a frequency band above approximately 100 kHz.

7. The apparatus of claim 1 wherein the power regulation, switch control signal is a duty cycle modulated signal having a pulse width and a period, and the controller is configured to spread the spectrum of the power regulation, switch control signal by modulating the period of the power regulation, switch control signal.

8. The apparatus of claim 1 wherein the power regulation, switch control signal is a duty cycle modulated signal having a pulse width and a period and the controller comprises:
   a period generator to generate a period of the power regulation, switch control signal; and
   a spread spectrum module, coupled to the period generator, to dither the period of the power regulation, switch control signal.

9. The apparatus of claim 8 wherein the spread spectrum module is configured to utilize nonrandom numbers with irregular step-sizes to dither the power regulation, switch control signal.

10. The apparatus of claim 1 wherein the controller is further configured to generate the power regulation, switch control signal with a maximum frequency.

11. The apparatus of claim 10 wherein the maximum frequency of the power regulation, switch control signal is set so that the fundamental frequency and a second harmonic frequency of the fundamental frequency is less than 150 kHz.

12. The apparatus of claim 11 wherein the fundamental frequency of the power regulation, switch control signal varies within a range of 53 kHz and 70 kHz, and the second harmonic frequency varies within a range of 106 kHz and 140 kHz.

13. The apparatus of claim 1 wherein the fundamental frequency of the power regulation, switch control signal is greater than approximately 5 kHz.

14. The apparatus of claim 1 wherein the controller is configured to generate the power regulation, switch control signal to provide power factor correction for the switching power converter and regulate an output voltage of the switching power converter.

15. The apparatus of claim 1 wherein the controller is configured to spread the spectrum of the fundamental frequency of the power regulation, switch control signal by 5% to 10% of a nominal value.

16. The apparatus of claim 1 wherein the controller is configured to operate the switching power converter in discontinuous conduction mode.

17. The apparatus of claim 1 further comprising:
   a switching power converter, wherein the switching power converter includes a switch coupled to the controller to receive the power regulation, switch control signal.

18. The apparatus of claim 1 wherein a precursor frequency of the power regulation, switch control signal varies from 20 kHz to 150 kHz.

19. The apparatus of claim 1 wherein the controller is further configured to generate an irregular spectrum spreading pattern using a nonrandom spectrum spreading pattern to modulate the pulse width of the power regulation, switch control signal.

20. An apparatus comprising:
   a controller to control a switching power converter, wherein the controller includes:
   a period generator to generate a precursor period value of a period of a duty cycle modulated, power regulation, switch control signal, wherein the power regulation, switch control signal is generated to control a switching power converter;
   a spread spectrum module, coupled to the period generator, to receive the precursor period value, select a step-size value to modify the precursor period value, and modulate the precursor period value with the selected step-size value to generate a varying period of the power regulation, switch control signal and thereby spread a spectrum of the power regulation, switch control signal; and
   a pulse width generator to modulate a pulse width of the power regulation, switch control signal in response to modulation of the period to provide power factor correction for the switching power converter.

21. The apparatus of claim 20 wherein a precursor frequency of the power regulation, switch control signal varies from 20 kHz to 150 kHz.

22. The apparatus of claim 20 wherein the controller is further configured to generate irregular step-size values using a nonrandom spectrum spreading pattern to modulate the pulse width of the power regulation, switch control signal.

23. A method comprising:
modulating a period of a power regulation, switch control signal for the switching power converter in accordance with a spread spectrum strategy to reduce electromagnetic interference, wherein at least 10% of the electromagnetic interference is above 5 kHz; and
modulating a pulse width of the power regulation, switch control signal in response to modulation of the period to provide power factor correction for the switching power converter.

24. The method of claim 23 wherein the spread spectrum strategy comprises modulating the period using irregular frequency changes.

25. The method of claim 23 wherein modulating a period of a power regulation, switch control signal for the switching power converter in accordance with a spread spectrum strategy comprises:
modulating the period using an spectrum spreading pattern having irregular step-size values for a particular precursor period, and a minimum and maximum of the irregular step-size values vary from each other by at least 10%.

26. The method of claim 25 wherein modulating a period of a power regulation, switch control signal for the switching power converter in accordance with a spread spectrum strategy further comprises:
generating the irregular spectrum spreading pattern using a nonrandom spectrum spreading pattern.

27. The method of claim 25 wherein modulating a period of a power regulation, switch control signal for the switching power converter in accordance with a spread spectrum strategy further comprises:
generating the irregular spectrum spreading pattern using a random number generator.

28. The method of claim 23 wherein modulating the period of the power regulation, switch control signal further comprises:
modulating a period of a power regulation, switch control signal for the switching power converter in accordance with a spread spectrum strategy to reduce electromagnetic interference in at least a frequency band above approximately 100 kHz.

29. The method of claim 23 wherein the power regulation, switch control signal is a duty cycle modulated signal having a pulse width and a period and the modulating a period of a power regulation, switch control signal further comprises:
dithering the period of the power regulation, switch control signal.

30. The method of claim 29 wherein dithering the period of the power regulation, switch control signal further comprises dithering the period of the power regulation, switch control signal using nonrandom numbers with irregular step-sizes.

31. The method of claim 23 wherein modulating a period of a power regulation, switch control signal for the switching power converter in accordance with a spread spectrum strategy further comprises modulating the period of the power regulation, switch control signal with a maximum frequency.

32. The method of claim 30 wherein the maximum frequency of the power regulation, switch control signal is set so that the fundamental frequency and a second harmonic frequency of the fundamental frequency is less than 150 kHz.

33. The method of claim 32 wherein the fundamental frequency of the power regulation, switch control signal varies within a range of 53 kHz and 70 kHz, and the second harmonic frequency varies within a range of 106 kHz and 140 kHz.

34. The method of claim 23 wherein the fundamental frequency of the power regulation, switch control signal is greater than approximately 5 kHz.

35. The method of claim 23 wherein modulating a pulse width of the power regulation, switch control signal further comprises modulating the pulse width of the power regulation, switch control signal to provide power factor correction for the switching power converter and regulate an output voltage of the switching power converter.

36. The method of claim 23 wherein modulating the period of the power regulation, switch control signal spreads the spectrum of the fundamental frequency of the power regulation, switch control signal by 5% to 10% of a nominal value.

37. The method of claim 23 wherein modulating the period and pulse width of the power regulation, switch control signal operates the switching power converter in discontinuous conduction mode.

38. The method of claim 23 wherein a precursor frequency of the power regulation, switch control signal varies from 20 kHz to 150 kHz.

39. The method of claim 23 wherein modulating a period of a power regulation, switch control signal for the switching power converter in accordance with a spread spectrum strategy further comprises generating an irregular spectrum spreading pattern using a nonrandom spectrum spreading pattern to modulate the pulse width of the power regulation, switch control signal.

* * * * *

UNITED STATES PATENT AND TRADEMARK OFFICE
CERTIFICATE OF CORRECTION

| | |
|---|---|
| PATENT NO. | : 8,723,438 B2 |
| APPLICATION NO. | : 12/781669 |
| DATED | : May 13, 2014 |
| INVENTOR(S) | : John L. Melanson and Michael A. Kost |

Page 1 of 1

It is certified that error appears in the above-identified patent and that said Letters Patent is hereby corrected as shown below:

Title page, item [54] and in the Specification, Column 1, in the Title, the first word "SWITCH" should be replaced with --SWITCHING--.

In the Claims

Column 13, Claim 3, line 42, the word "an" should be replaced with --a--.

Column 15, Claim 25, line 25, the word "an" should be replaced with --a--.

Signed and Sealed this
Twenty-eighth Day of April, 2015

Michelle K. Lee
*Director of the United States Patent and Trademark Office*